(12) United States Patent
Zou (10) Patent No.: US 12,267,966 B2
(45) Date of Patent: Apr. 1, 2025

(54) SPLICED BOX AND SPLICED DISPLAY SCREEN

(71) Applicant: TCL China Star Optoelectronics Technology Co., Ltd., Guangdong (CN)

(72) Inventor: Guangnan Zou, Guangdong (CN)

(73) Assignee: TCL China Star Optoelectronics Technology Co., Ltd., Guangdong (CN)

( * ) Notice: Subject to any disclaimer, the term of this patent is extended or adjusted under 35 U.S.C. 154(b) by 0 days.

(21) Appl. No.: 17/598,314

(22) PCT Filed: Jul. 26, 2021

(86) PCT No.: PCT/CN2021/108451
§ 371 (c)(1),
(2) Date: Sep. 27, 2021

(87) PCT Pub. No.: WO2023/284003
PCT Pub. Date: Jan. 19, 2023

(65) Prior Publication Data
US 2024/0049404 A1 Feb. 8, 2024

(30) Foreign Application Priority Data
Jul. 16, 2021 (CN) .......................... 202110804597.5

(51) Int. Cl.
*H05K 5/00* (2006.01)
*G09F 9/302* (2006.01)
*G09F 9/33* (2006.01)

(52) U.S. Cl.
CPC ......... *H05K 5/0021* (2013.01); *G09F 9/3026* (2013.01); *G09F 9/33* (2013.01)

(58) Field of Classification Search
CPC ........ H05K 5/0021; G09F 9/3026; G09F 9/33
See application file for complete search history.

(56) References Cited

U.S. PATENT DOCUMENTS 10,667,414 B2 * 5/2020 Kim ..................... H05K 5/0208
11,184,986 B2 * 11/2021 Heo ..................... H05K 5/0008
(Continued)

FOREIGN PATENT DOCUMENTS

CN     203799606      8/2014
CN     104175116     12/2014
(Continued)

OTHER PUBLICATIONS

Decision of Rejection Dated Jul. 8, 2022 From The State Intellectual Property Office of the People's Republic of China Re. Application No. 202110804597.5 and Its Translation Into English. (15 Pages).
International Search Report and the Written Opinion Dated Apr. 14, 2022 From the International Searching Authority Re. Application No. PCT/CN2021/108451 and Its Translation Into English. (16 Pages).
(Continued)

*Primary Examiner* — Doon Y Chow
(74) *Attorney, Agent, or Firm* — PV IP PC; Wei Te Chung (57) ABSTRACT

The present application relates to a spliced box and a spliced display screen. In the process of splicing and assembling a plurality of boxes, when there is a height difference between a second surface of a certain box and a second surface of other boxes, the first adjusting member at the box is adjusted to raise or lower the box so that the height of the second surface of the box is adjusted. As a result, the second surface of the box is on the same plane as the second surface of other boxes so that the display units on the second surface of the boxes are on the same plane.

18 Claims, 5 Drawing Sheets

(56) References Cited

U.S. PATENT DOCUMENTS

| | | | |
|---|---|---|---|
| 11,474,571 B2* | 10/2022 | Jeong | ................. G06F 1/203 |
| 11,545,602 B2* | 1/2023 | Oh | ................. G02F 1/13336 |
| 2004/0123501 A1 | 7/2004 | Safavi et al. | |
| 2015/0205564 A1 | 7/2015 | Xu et al. | |
| 2016/0210886 A1* | 7/2016 | Brashnyk | ................. G09F 9/33 |
| 2017/0006727 A1* | 1/2017 | Ryu | ................. H01L 25/0753 |
| 2019/0166704 A1 | 5/2019 | Shin et al. | |
| 2019/0294401 A1 | 9/2019 | Chen | |
| 2020/0372841 A1 | 11/2020 | Mudd | |

FOREIGN PATENT DOCUMENTS

| | | |
|---|---|---|
| CN | 104575309 | 4/2015 |
| CN | 206421778 | 8/2017 |
| CN | 209328409 | 8/2019 |
| CN | 110992848 | 4/2020 |
| CN | 111105720 | 5/2020 |
| CN | 210777646 | 6/2020 |
| CN | 111405792 | 7/2020 |
| CN | 211928967 | 11/2020 |
| CN | 212906856 | 4/2021 |
| CN | 213123600 | 5/2021 |
| JP | 2009-076607 | 4/2009 |
| JP | 2016-142861 | 8/2016 |
| JP | 2017-506368 | 3/2017 |
| KR | 10-2017-0133174 | 12/2017 |
| KR | 10-2019-0061745 | 6/2019 |
| KR | 10-2023871 | 9/2019 |
| WO | WO 2020/225907 | 11/2020 |

OTHER PUBLICATIONS

Notice of Reasons for Refusal Dated Sep. 22, 2023 From the Japan Patent Office Re. Application No. 2021-547739 and Its Translation Into English. (10 Pages).

Notification of Office Action and Search Report Dated Apr. 14, 2022 From The State Intellectual Property Office of the People's Republic of China Re. Application No. 202110804597.5 and Its Translation Into English. (17 Pages).

Notification of Office Action and Search Report Dated Jan. 27, 2022 From The State Intellectual Property Office of the People's Republic of China Re. Application No. 202110804597.5 and Its Translation Into English. (17 Pages).

Request for the Submission of An Opinion Dated Dec. 16, 2022 From the Koran Intellectual Property Office Re. Application No. 10-2021-7028273 and Its Translation Into English. (15 Pages).

* cited by examiner

SPLICED BOX AND SPLICED DISPLAY SCREEN

RELATED APPLICATIONS

This application is a National Phase of PCT Patent Application No. PCT/CN2021/108451 having International filing date of Jul. 26, 2021, which claims the benefit of priority of Chinese Patent Application No. 202110804597.5 filed on Jul. 16, 2021. The contents of the above applications are all incorporated by reference as if fully set forth herein in their entirety.

FIELD AND BACKGROUND OF THE INVENTION

The present application relates to a field of splicing display technology and particularly relates to a spliced box and a spliced display screen.

At present, due to monitoring technology and data collection capabilities have been improved to a certain extent. Whether a display terminal can accurately display collected data on a display wall in real-time is directly related to rationality of a decision issued by a superior department, which is quite critical. In order to meet a need of a market, technicians of the display terminal need to improve current technology and make it develop in a direction of seamless and high-definition. Therefore, light-emitting diode (LED) spliced displays came into being.

However, the current process cannot guarantee that the flatness of the spliced box of the spliced display screen is zero. In addition, in a process of splicing and assembling a plurality of boxes, there will be height differences or gaps between the boxes, which affects the display effect of the spliced display screen. Therefore, it is necessary to seek a new type of spliced display screen to solve the above-mentioned problems.

SUMMARY OF THE INVENTION

The purpose of the present application is to provide a spliced box and a spliced display screen. It can solve the problems that the current spliced display screen has a height difference or gap between the boxes, which affects the display effect of the spliced display screen.

In order to solve the above-mentioned problems, the present application provides a spliced box, which includes a plurality of boxes, each box includes: a base and connecting bases located at four corners of the base, the base has a first surface and an opposing second surface, the connecting bases protrude from the first surface of the base, and each connecting base is defined with at least one first fastening hole; a splicing gasket covering at least two of the connecting bases adjacent to each other, wherein the splicing gasket is defined with a plurality of second fastening holes, the plurality of second fastening holes of the splicing gasket correspond one-to-one with the first fastening holes of the connecting base covered by the splicing gasket; and the splicing gasket is defined with at least one first adjusting hole at a position corresponding to each of the connecting bases covered by the splicing gasket; a plurality of first fasteners, wherein each first fastener passes through one of the second fastening holes and one of the first fastening holes; and a plurality of first adjusting members, wherein each first adjusting member passes through one of the first adjusting holes and abuts against a side surface of one of the connecting bases away from the first surface.

Further, each of the boxes further includes: a first side plate protruding from the first surface of the base; a second side plate protruding from the first surface of the base and arranged opposite to the first side plate; wherein the first side plate is defined with at least one third fastening hole penetrating therethrough, the second side plate is defined with at least one fourth fastening hole penetrating therethrough, and the third fastening holes correspond to the fourth fastening holes in one-to-one correspondence; and wherein the spliced box further includes a plurality of second fasteners, each second fastener passes through the third fastening hole of one of the boxes and the fourth fastening hole of another one of the boxes.

Further, each box further includes: a third side plate protruding from the first surface of the base and perpendicular to the first side plate; a fourth side plate protruding from the first surface of the base and arranged opposite to the third side plate; wherein the third side plate is defined with at least one fifth fastening hole, the fourth side plate is defined with at least one sixth fastening hole, and the fifth fastening holes correspond to the sixth fastening holes in one-to-one correspondence; and wherein the spliced box further includes third fasteners, each third fastener passes through the fifth fastening hole of one of the boxes and the sixth fastening hole of another one of the boxes.

Further, the first side plate is further defined with at least one second adjusting hole penetrating therethrough; and wherein the spliced box further includes second adjusting members, each second adjusting member passes through the second adjusting hole of one of the boxes and abuts against an outer surface of the second side plate of another one of the boxes adjacent to the box.

Further, the third side plate is further defined with at least one third adjusting hole penetrating therethrough; and wherein the spliced box further includes third adjusting members, each third adjusting member passes through the third adjusting hole of one of the boxes and abuts against an outer surface of the fourth side plate of another one of the boxes adjacent to the box.

Further, the spliced box further includes: at least one first snap-fit male end located on an outer surface of the first side plate; at least one first snap-fit female end located on the outer surface of the second side plate and corresponding to the first snap-fit male ends in one-to-one correspondence; and wherein one of the first snap-fit male ends of each box is fitted into one of the first snap-fit female ends of another box adjacent to the box.

Further, the spliced box further includes: at least one second snap-fit male end located on an outer surface of the third side plate; at least one second snap-fit female end located on an outer surface of the fourth side plate and corresponding to the at least one second snap-fit male end in one-to-one correspondence; and wherein one of the second snap-fit male ends of each box is fitted into one of the second snap-fit female ends of another box adjacent to the box.

In order to solve the above-mentioned problems, the present application further provides a spliced display screen, which includes the spliced box mentioned in the present application.

Further, the spliced display screen further includes a plurality of display units arranged in an array on the second surface of the box.

Further, the display unit includes one of a mini light-emitting diode (LED) display unit, a micro-LED display unit, or an organic light-emitting diode (OLED) display unit.

The present application relates to a spliced box and a spliced display screen. In a process of splicing and assembling a plurality of boxes, a first adjusting member passes through a first adjusting hole to abut against a side of the connecting base away from a first surface. When there is a height difference between the second surface of a certain box and the second surface of other boxes, the first adjusting member at the box is adjusted to raise or lower the box, thereby adjusting the height of the second surface of the box. As a result, the second surface of the box is on the same plane as the second surfaces of other boxes so that the display units on the second surfaces of the boxes are on the same plane. Therefore, the screen resolution can be improved in a small area, the quality of the picture can be ensured, and the user's demand for close viewing can be met. In the process of splicing and assembling the plurality of boxes, a gap between adjacent boxes is adjusted through a second adjusting member and a third adjusting member. In this way, seamless splicing between display units can be realized to meet the requirements of a multi-screen display, and it can also prevent adjacent display units from overlapping and affecting the display effect.

BRIEF DESCRIPTION OF THE SEVERAL VIEWS OF THE DRAWINGS

In order to more clearly describe the technical solutions in the embodiments of the present application, the following will briefly introduce the drawings that need to be used in the description of the embodiments. Obviously, the drawings in the description are only some embodiments of the present application. For those skilled in the art, without doing creative work, other drawings can be obtained based on these drawings.

REFERENCE SIGNS spliced box 100; box 1; base 2; connecting base 3; splicing gasket 4; first fastener 5; first adjusting member 6; first side plate 7; second side plate 8; third side plate 9; fourth side plate 10; second fastener 11; third fastener 12; second adjusting member 13; third adjusting member 14; first snap-fit male end 15; first snap-fit female end 16; first surface 21; first fastening hole 31; first splicing gasket 41; second splicing gasket 42; second fastening hole 43; first adjusting hole 44; third fastening hole 71; fourth fastening hole 81; fifth fastening hole 91; sixth fastening hole 101; second adjusting hole 72; third adjusting hole 92.

DESCRIPTION OF SPECIFIC EMBODIMENTS OF THE INVENTION

The preferred embodiments of the application will be described in detail with reference to the accompanying drawings of the specification, so as to fully introduce the technical content of the present application. The following embodiments will be used to demonstrate that the present application can be implemented, so that the technical content disclosed in the present application is clearer, and it is easier for those skilled in the art to understand how to implement the present application. However, the present application can be embodied by various forms of embodiments. The protection scope of the present application is not limited to the embodiments mentioned in the specification, and the description of the embodiments is not intended to limit the scope of the present application.

The directional terms mentioned in the present invention, such as "above", "below", "front", "back", "left", "right", "inside", "outside", "side", etc., are only directions referring to the attached drawings. The directional terms are used to describe and understand the present invention, rather than limit the present invention.

In the drawings, components with the same structure are denoted by the same numerals, and components with similar structures or functions are denoted by similar numerals. In addition, for ease of understanding and description, the size and thickness of each component shown in the drawings are arbitrarily shown, and the present application does not limit the size and thickness of each component.

Embodiment 1

Figure 1:
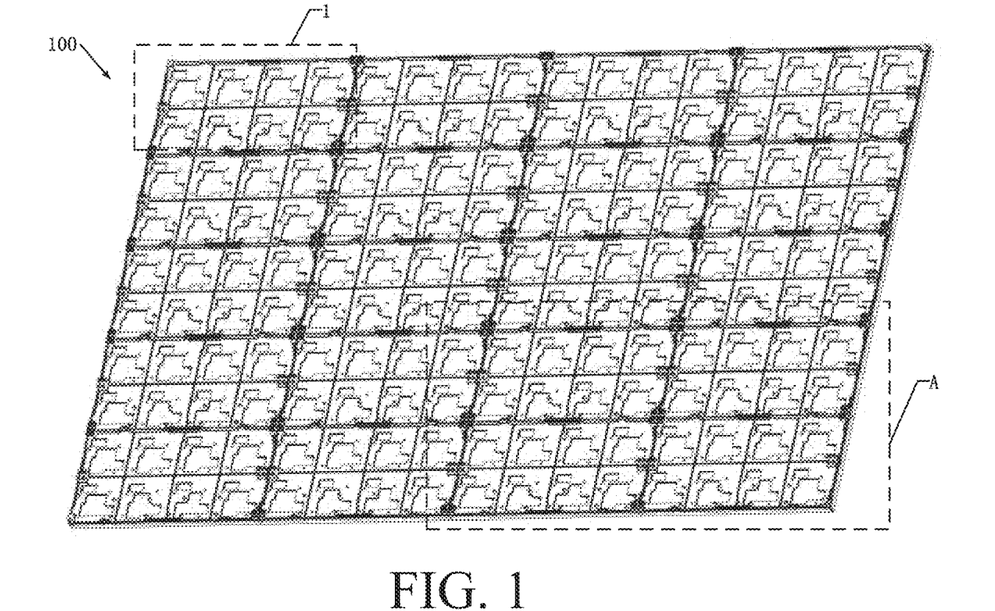
FIG. 1 is a schematic diagram of a structure of a spliced box of the present application.

As shown in FIG. 1, the present embodiment provides a splicing box 100. The spliced box 100 includes a plurality of boxes 1 that are spliced and fixed to each other. In this embodiment, the boxes 1 are arranged in 5 rows and 4 columns. In other embodiments, the number of rows and columns of the boxes 1 can be adjusted according to actual needs.

Figure 2:
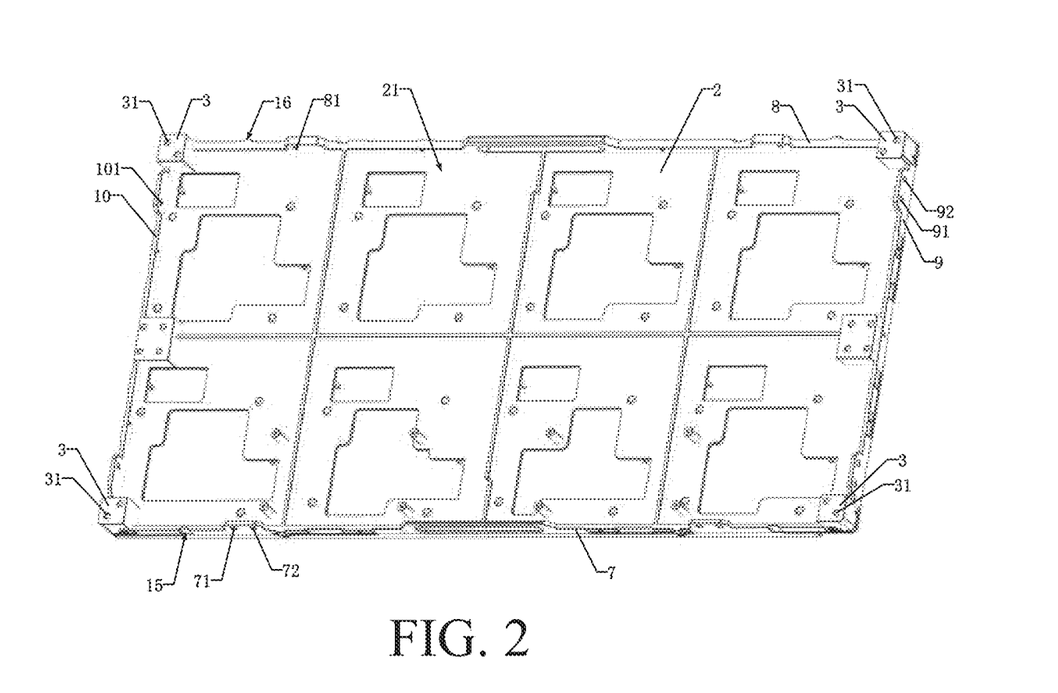
FIG. 2 is a schematic diagram of a structure of a box of the present application.
Figure 3:
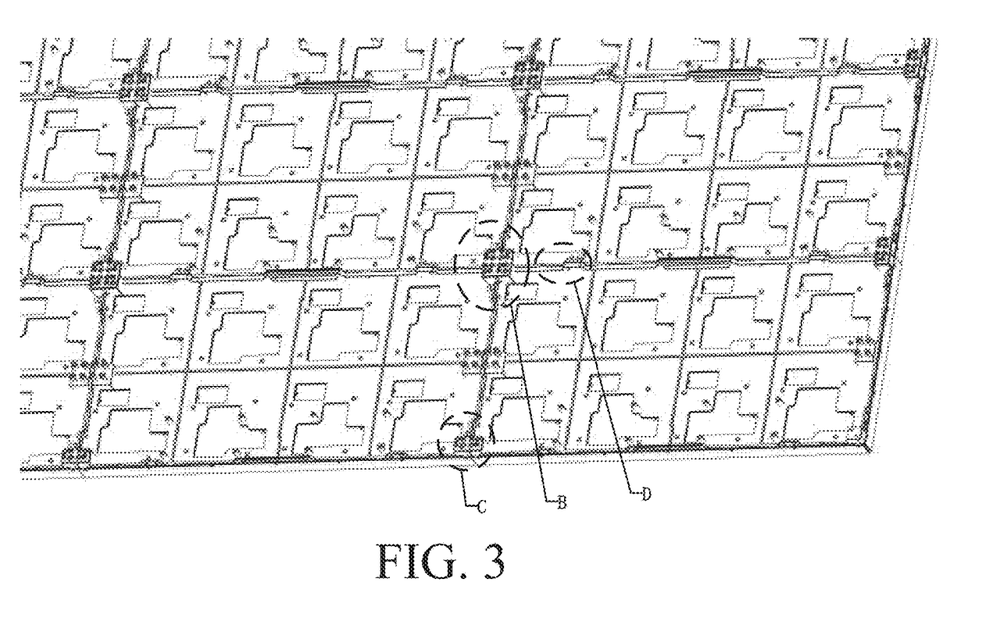
FIG. 3 is a partially enlarged view of a part at dashed frame A in FIG. 1.
Figure 4:
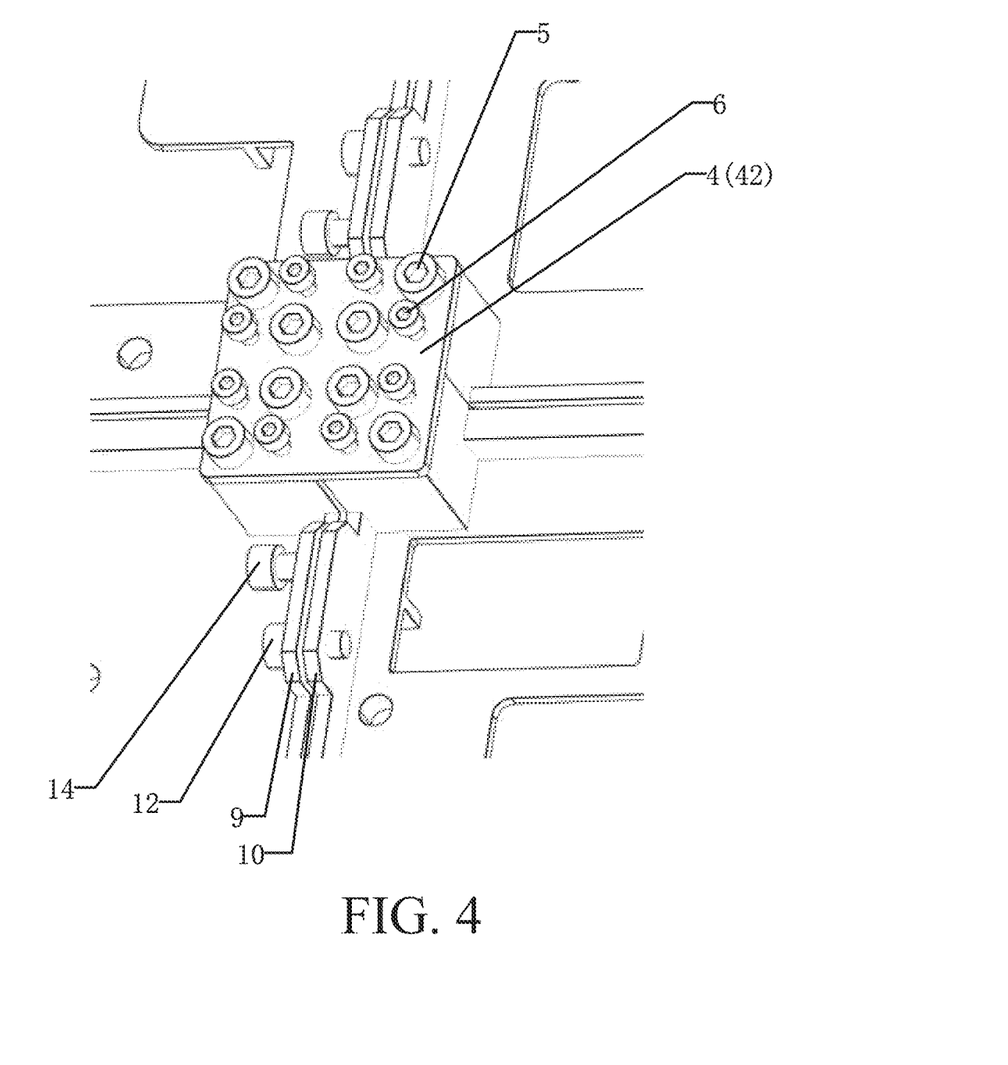
FIG. 4 is a partially enlarged view of a part at dotted frame B in FIG. 3.
Figure 5:
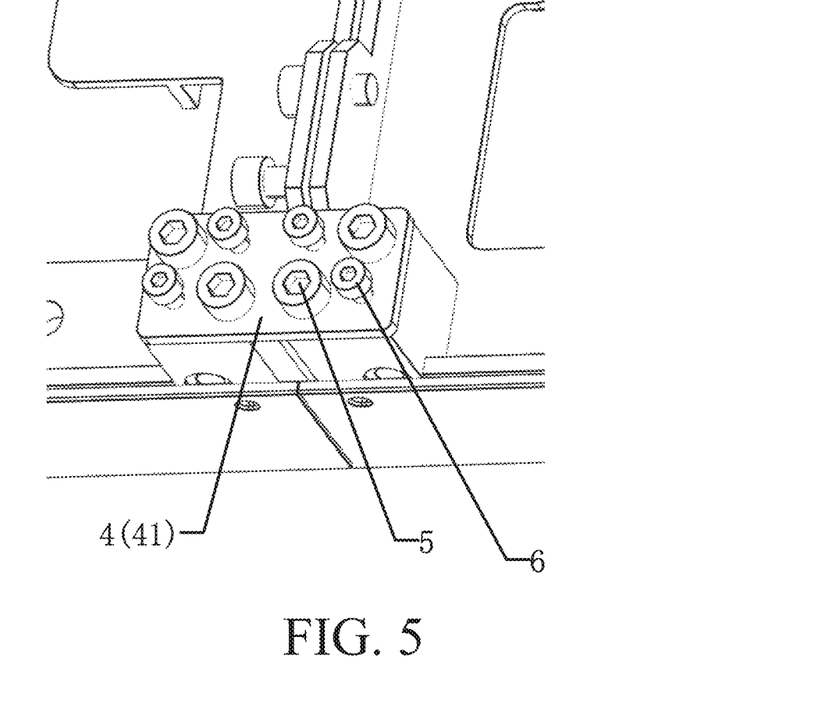
FIG. 5 is a partially enlarged view of a part at dotted frame C in FIG. 3.
Figure 6:
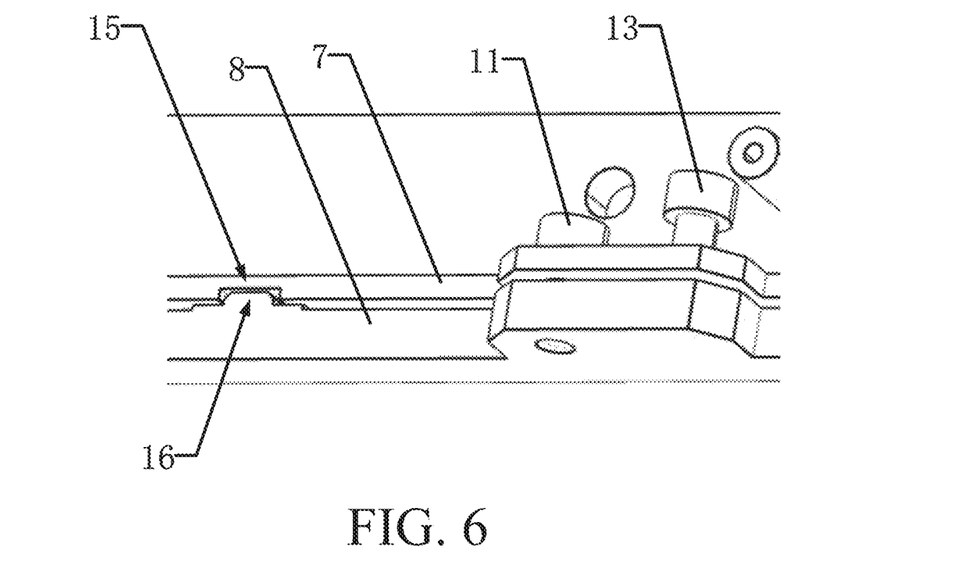
FIG. 6 is a partially enlarged view of a part at dotted frame D in FIG. 3.
Figure 7:
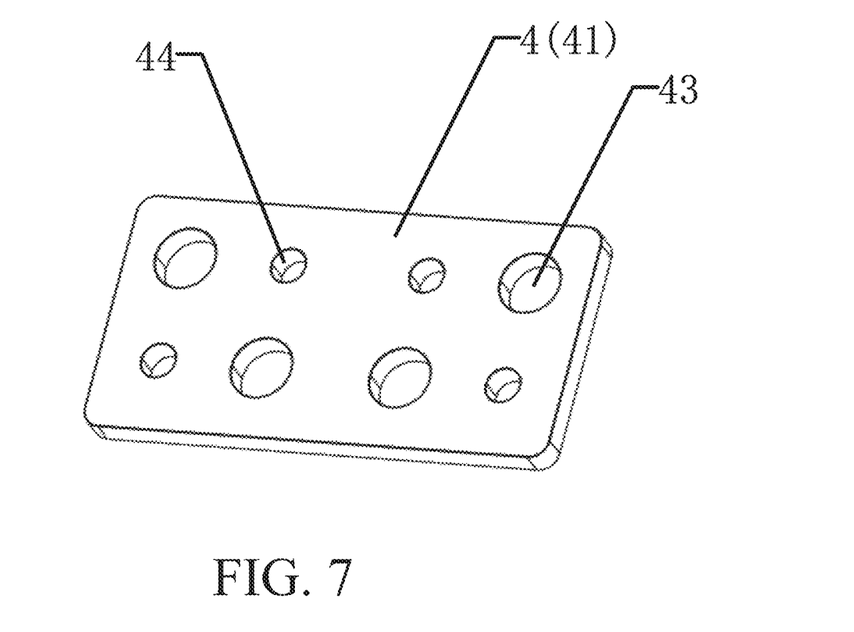
FIG. 7 is a schematic diagram of a structure of a first gasket of the present embodiment.
Figure 8:
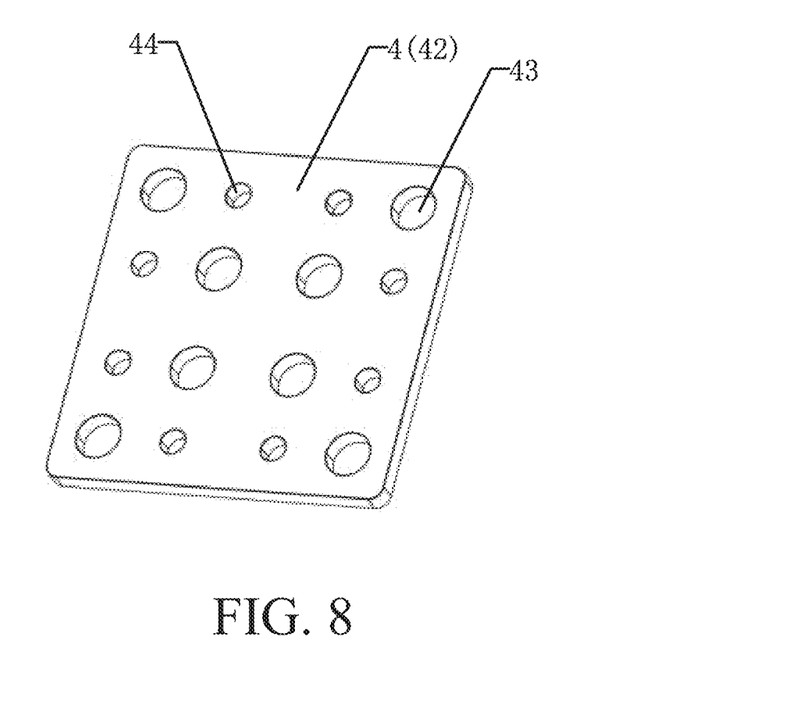
FIG. 8 is a schematic diagram of a structure of a second gasket of the present embodiment.

As shown in FIG. 2, each box 1 includes a base 2 and a connecting base 3.

As shown in FIG. 2, the base 2 has a first surface 21 and an opposing second surface (not shown).

As shown in FIG. 2, the connecting base 3 protrudes from the first surface 21 of the base 2 and is located at four corners of the base 2. Each connecting base 3 is defined with at least one first fastening hole 31. In this embodiment, each of the connecting bases 3 is defined with two first fastening holes 31. In this embodiment, the first fastening hole 31 is a screw hole.

As shown in FIG. 3 to FIG. 8, the spliced box 100 further includes a splicing gasket 4. The splicing gasket 4 covers at least two adjacent connecting bases 3.

In this embodiment, the splicing gasket 4 is divided into a first splicing gasket 41 and a second splicing gasket 42. The first splicing gasket 41 is located at the edge of the spliced box 100 and covers two adjacent connecting bases 3. The second splicing gasket 42 is located in the middle of the spliced box 100 and covers the four connecting bases 3.

As shown in FIG. 3 to FIG. 8, each splicing gasket 4 is defined with a plurality of second fastening holes 43 penetrating therethrough. The second fastening holes 43 on each splicing gasket 4 correspond to the first fastening holes 31 on the connecting base 3 covered by the splicing gasket 4 in one-to-one correspondence. In this embodiment, each of the connecting bases 3 is defined with two first fastening holes 31, and the first splicing gasket 41 only covers two connecting bases 3. Therefore, each first splicing gasket 41 is defined with a total of four second fastening holes 43 at positions corresponding to the first fastening holes 31 on the two connecting bases 3 covered by the first splicing gasket 41. Each connecting base 3 is defined with two first fastening holes 31, and the second splicing gasket 42 covers four connecting bases 3. Therefore, each second splicing gasket 42 is defined with a total of eight second fastening holes 43 at positions corresponding to the first fastening holes 31 on the four connecting bases 3 covered by the second splicing gasket 42. In this embodiment, the second fastening hole 43 is a screw hole.

As shown in FIG. 3 to FIG. 8, each splicing gasket 4 is defined with at least one first adjusting hole 44 at a position corresponding to each connecting base 3 covered by the splicing gasket 4. In this embodiment, each splicing gasket 4 is defined with two first adjusting holes 44 at a position corresponding to each of the connecting bases 3 covered by the splicing gasket 4. Specifically, in this embodiment, the first splicing gasket 41 is defined with four first adjusting holes penetrating therethrough. The second splicing gasket 42 is defined with eight first adjusting holes 44 penetrating therethrough. In this embodiment, the first adjusting hole 44 is a screw hole.

Wherein, the spliced box 100 further includes a plurality of first fasteners 5. Each first fastener 5 passes through one of the second fastening holes 43 and one of the first fastening holes 31, thereby realizing the splicing and fixing of a plurality of boxes 1. In this embodiment, the first fastener 5 is a screw.

Wherein, the spliced box 100 further includes a plurality of first adjusting members 6. Each first adjusting member 6 passes through a first adjusting hole 44 and abuts against a side surface of the connecting base 3 away from the first surface 21. Specifically, each first adjusting member 6 passes through the first adjusting hole 44 of a splicing gasket 4 and abuts against the side of the connecting base 3 corresponding to the splicing gasket 4 away from the first surface 21. In this embodiment, the first adjusting member 6 is a screw.

As mentioned above, in the process of assembling a plurality of boxes 1, when there is a height difference between the second surface of a certain box 1 and the second surface of other boxes 1, the first adjusting member 6 at the box 1 is adjusted to raise or lower the box 1 so that the height of the second surface of the box 1 is adjusted. As a result, the second surface of the box 1 is on the same plane as the second surface of other boxes 1 so that the products on the second surface of the boxes 1 are on the same plane. Specifically, when the second surface of a certain box 1 is slightly lower than the second surface of the other box 1, the box 1 can be lifted up by adjusting the first adjusting member 6 of the box, so that the second surface of the box 1 and the second surfaces of other boxes 1 are on the same plane. Similarly, when the second surface of a certain box 1 is slightly higher than the second surface of other boxes 1, the box 1 can be lowered by adjusting the first adjusting member 6 of the box, so that the second surface of the box 1 and the second surfaces of other boxes 1 are on the same plane.

As shown in FIG. 3 to FIG. 6, each of the boxes 1 further includes a first side plates 7, a second side plate 8, a third side plate 9, and a fourth side plate 10 protruding from the first surface and located on the four sides of the base 2.

As shown in FIG. 3 to FIG. 6, the second side plate 8 is opposite to the first side plate 7 and is parallel to the first side plate 7.

As shown in FIG. 3 to FIG. 6, the first side plate 7 is defined with at least one third fastening hole 71 penetrating therethrough, the second side plate 8 is defined with at least one fourth fastening hole 81 penetrating therethrough, and the third fastening holes 71 correspond to the fourth fastening holes 81 in one-to-one correspondence. In this embodiment, the third fastening hole 71 and the fourth fastening hole 81 are both screw holes.

As shown in FIG. 3 to FIG. 6, the spliced box 100 further includes a plurality of second fasteners 11. Each second fastener 11 passes through the third fastening hole 71 of one box 1 and the fourth fastening hole 81 of the other box 1, thereby strengthening the fixing effect between two adjacent boxes 1. In this embodiment, the second fastener 11 is a screw.

As shown in FIG. 3 to FIG. 6, the fourth side plate 10 is opposite to the third side plate 9, and is parallel to the third side plate 9 and perpendicular to the first side plate 7.

As shown in FIG. 3 to FIG. 6. The third side plate 9 is defined with at least one fifth fastening hole 91 penetrating therethrough, the fourth side plate 10 is defined with at least one sixth fastening hole 101 penetrating therethrough, and the fifth fastening hole 91 corresponds to the sixth fastening hole 101 in one-to-one correspondence. In this embodiment, the fifth fastening hole 91 and the sixth fastening hole 101 are both screw holes.

As shown in FIG. 3 to FIG. 6, the spliced box further includes a plurality of third fasteners 12. Each third fastener 12 passes through the fifth fastening hole 91 of one box 1 and the sixth fastening hole 101 of the other box 1, thereby strengthening the fixing effect between two adjacent boxes 1. In this embodiment, the third fastener 12 is a screw.

As shown in FIG. 3 to FIG. 6, the first side plate 7 is further defined with at least one second adjusting hole 72 penetrating therethrough. The spliced box 100 further includes a plurality of second adjusting members 13, each second adjusting member 13 passes through the second adjusting hole 72 of one box 1 and abuts against the outer surface of the second side plate 8 of another box 1 adjacent to the box 1. In this embodiment, the second adjusting hole 72 is a screw hole. In this embodiment, the second adjusting member 13 is a screw.

As shown in FIG. 3 to FIG. 6, the third side plate 9 is further provided with at least one third adjusting hole 92 penetrating therethrough. The spliced box 100 further includes a plurality of third adjusting members 14, each third adjusting member 14 passes through the third adjusting hole 92 of one box 1 and abuts against the outer surface of the fourth side plate 10 of another box 1 adjacent to the box 1. In this embodiment, the third adjustment hole 92 is a screw hole. In this embodiment, the third adjusting member 14 is a screw.

In summary, during the assembling process of a plurality of boxes 1, the gap between adjacent boxes 1 is adjusted through the second adjusting member 13 and the third adjusting member 14.

As shown in FIG. 3 to FIG. 6, the spliced box 100 further includes at least one first snap-fit male end 15 and at least one first snap-fit female end 16. The first snap-fit male end 15 is located on the outer surface of the first side plate 7, the first snap-fit female end 16 is located on the outer surface of the second side plate 8 and corresponds to the first snap-fit male end in one-to-one correspondence. The first snap-fit male end 15 of each box 1 is fitted into the first snap-fit female end 16 of the box 1 adjacent to the box 1, thereby realizing the alignment assembly of two adjacent boxes 1.

As shown in FIG. 3 to FIG. 6, the spliced box 100 further includes at least one second snap-fit male end (not shown) and at least one second snap-fit female end (not shown). The second snap-fit male end is located on the outer surface of the third side plate 9, the second snap-fit female end is located on the outer surface of the fourth side plate 10 and corresponds to the second snap-fit male end in one-to-one correspondence. The second snap-fit male end of each box 1 is fitted into the second snap-fit female end of the box 1 adjacent to the box 1, thereby realizing the alignment assembly of two adjacent boxes 1.

Embodiment 2

The present embodiment further provides a spliced display screen. The spliced display screen includes the spliced box 100 of embodiment 1 and a plurality of display units.

Wherein, the display units are arranged in an array on the second surface of the box 1. The display unit includes one of a mini light-emitting diode (LED) display unit, a micro-LED display unit, or an organic light-emitting diode (OLED) display unit. In this embodiment, the display unit is a mini-LED display unit.

In the process of splicing and assembling a plurality of boxes 1, when there is a height difference between the second surface of a certain box 1 and the second surface of other boxes 1, the first adjusting member 6 at the box 1 is adjusted to raise or lower the box 1 so that the height of the second surface of the box 1 is adjusted. As a result, the second surface of the box 1 is on the same plane as the second surface of other boxes 1 so that the display units on the second surface of the boxes 1 are on the same plane. Therefore, the screen resolution can be improved in a small area, the quality of the picture can be ensured, and the user's demand for close viewing can be met.

Specifically, when the second surface of a certain box 1 is slightly lower than the second surface of the other box 1, the box 1 can be lifted up by adjusting the first adjusting member 6 of the box, so that the second surface of the box 1 and the second surfaces of other boxes 1 are on the same plane. Similarly, when the second surface of a certain box 1 is slightly higher than the second surface of other boxes 1, the box 1 can be lowered by adjusting the first adjusting member 6 of the box, so that the second surface of the box 1 and the second surfaces of other boxes 1 are on the same plane.

In the process of assembling a plurality of boxes 1, the gap between adjacent boxes 1 is adjusted through the second adjusting member 13 and the third adjusting member 14. In this way, seamless splicing between display units can be realized to meet the requirements of a multi-screen display, and it can also prevent adjacent display units from overlapping and affecting the display effect.

The spliced box and the spliced display screen provided by the present application are described in detail above. This article uses specific embodiments to describe the principles and implementation of the present application. The description of the above embodiments is only used to help understand the methods and core ideas of the present application. Meanwhile, for those skilled in the art, according to the idea of the present application, there will be changes in the specific implementation and the scope of the present application. As mentioned above, the content of the specification should not be construed as a limitation to the present application.

What is claimed is:

1. A spliced box comprising:
   boxes, wherein each box comprises a base having a first surface and an opposing second surface, connecting bases located at four corners of the base and protruding from the first surface of the base, a first side plate protruding from the first surface of the base;
   and a second side plate protruding from the first surface of the base and arranged opposite to the first side plate, and each connecting base is defined with first fastening holes;
   a splicing gasket covering at least two of the connecting bases adjacent to each other, wherein the splicing gasket is defined with second fastening holes, the second fastening holes of the splicing gasket correspond one-to-one with the first fastening holes of the connecting base covered by the splicing gasket, the splicing gasket is defined with first adjusting holes at a position corresponding to each of the connecting bases covered by the splicing gasket, and the first adjusting holes are threaded holes;
   first fasteners, wherein each first fastener passes through one of the second fastening holes and one of the first fastening holes;
   first adjusting members capable of eliminating a height difference between the second surfaces of the bases of two adjacent ones of the boxes, wherein the first adjusting members are of a threaded structure, and each first adjusting member passes through one of the first adjusting holes and abuts against a side surface of one of the connecting bases away from the first surface, and
   second adjusting members, wherein the first side plate is defined with a second adjusting hole penetrating therethrough; each second adjusting member passes through the second adjusting hole of one of the boxes and abuts against an outer surface of the second side plate of another one of the boxes adjacent to the box to adjust a gap between adjacent boxes, and the second adjusting members are a threaded member.

2. The spliced box of claim 1,
   wherein the first side plate is defined with a third fastening hole penetrating therethrough, the second side plate is defined with a fourth fastening hole penetrating therethrough, and the third fastening hole corresponds to the fourth fastening hole; and
   wherein the spliced box further comprises second fasteners, each second fastener passes through the third fastening hole of one of the boxes and the fourth fastening hole of another one of the boxes.

3. The spliced box of claim 2, wherein each box further comprises:
   a third side plate protruding from the first surface of the base and perpendicular to the first side plate;
   a fourth side plate protruding from the first surface of the base and arranged opposite to the third side plate;
   wherein the third side plate is defined with a fifth fastening hole, the fourth side plate is defined with a sixth fastening hole, and the fifth fastening hole corresponds to the sixth fastening hole; and
   wherein the spliced box further comprises third fasteners, each third fastener passes through the fifth fastening hole of one of the boxes and the sixth fastening hole of another one of the boxes.

4. The spliced box of claim 3, wherein the third side plate is further defined with a third adjusting hole penetrating therethrough; and
   wherein the spliced box further comprises third adjusting members, each third adjusting member passes through the third adjusting hole of one of the boxes and abuts against an outer surface of the fourth side plate of another one of the boxes adjacent to the box.

5. The spliced box of claim 2, further comprising:
   first snap-fit male ends located on an outer surface of the first side plate;

first snap-fit female ends located on the outer surface of the second side plate and corresponding to the first snap-fit male ends in one-to-one correspondence; and wherein one of the first snap-fit male ends of each box is fitted into one of the first snap-fit female ends of another box adjacent to the box.

6. The spliced box of claim 3, further comprising:
second snap-fit male ends located on an outer surface of the third side plate;
second snap-fit female ends located on an outer surface of the fourth side plate and corresponding to the at least one second snap-fit male end in one-to-one correspondence; and
wherein one of the second snap-fit male ends of each box is fitted into one of the second snap-fit female ends of another box adjacent to the box.

7. A splicing display screen comprising a spliced box, wherein the spliced box comprises:
boxes, wherein each box comprises a base having a first surface and an opposing second surface, connecting bases located at four corners of the base and protruding from the first surface of the base, a first side plate protruding from the first surface of the base;
and a second side plate protruding from the first surface of the base and arranged opposite to the first side plate, and each connecting base is defined with first fastening holes;
a splicing gasket covering at least two of the connecting bases adjacent to each other, wherein the splicing gasket is defined with second fastening holes, the second fastening holes of the splicing gasket correspond one-to-one with the first fastening holes of the connecting base covered by the splicing gasket, the splicing gasket is defined with first adjusting holes at a position corresponding to each of the connecting bases covered by the splicing gasket, and the first adjusting holes are threaded holes;
first fasteners, wherein each first fastener passes through one of the second fastening holes and one of the first fastening holes;
first adjusting members capable of eliminating a height difference between the second surfaces of the bases of two adjacent ones of the boxes, wherein the first adjusting members are of a threaded structure, and each first adjusting member passes through one of the first adjusting holes and abuts against a side surface of one of the connecting bases away from the first surface, and
second adjusting members, wherein the first side plate is defined with a second adjusting hole penetrating therethrough; each second adjusting member passes through the second adjusting hole of one of the boxes and abuts against an outer surface of the second side plate of another one of the boxes adjacent to the box to adjust a gap between adjacent boxes, and the second adjusting members are a threaded member.

8. The splicing display screen of claim 7,
wherein the first side plate is defined with a third fastening hole penetrating therethrough, the second side plate is defined with a fourth fastening hole penetrating therethrough, and the third fastening hole corresponds to the fourth fastening hole; and
wherein the spliced box further comprises second fasteners, each second fastener passes through the third fastening hole of one of the boxes and the fourth fastening hole of another one of the boxes.

9. The spliced display screen of claim 8, wherein each box further comprises:
a third side plate protruding from the first surface of the base and perpendicular to the first side plate;
a fourth side plate protruding from the first surface of the base and arranged opposite to the third side plate;
wherein the third side plate is defined with a fifth fastening hole, the fourth side plate is defined with a sixth fastening hole, and the fifth fastening hole corresponds to the sixth fastening hole; and
wherein the spliced box further comprises third fasteners, each third fastener passes through the fifth fastening hole of one of the boxes and the sixth fastening hole of another one of the boxes.

10. The spliced display screen of claim 9, wherein the third side plate is further defined with a third adjusting hole penetrating therethrough; and
wherein the spliced box further comprises third adjusting members, each third adjusting member passes through the third adjusting hole of one of the boxes and abuts against an outer surface of the fourth side plate of another one of the boxes adjacent to the box.

11. The spliced display screen of claim 8, further comprising:
first snap-fit male ends located on an outer surface of the first side plate;
first snap-fit female ends located on the outer surface of the second side plate and corresponding to the first snap-fit male ends in one-to-one correspondence; and
one of the first snap-fit male ends of each box is fitted into one of the first snap-fit female ends of another box adjacent to the box.

12. The spliced display screen of claim 9, further comprising:
second snap-fit male ends located on an outer surface of the third side plate;
second snap-fit female ends located on the outer surface of the fourth side plate and corresponding to the second snap-fit male ends in one-to-one correspondence; and
wherein one of the second snap-fit male ends of each box is fitted into one of the second snap-fit female ends of another box adjacent to the box.

13. The spliced display screen of claim 7, wherein the first fastening holes and the second fastening holes are screw holes, and the first fasteners and the first adjusting members are screws.

14. The spliced display screen of claim 9, wherein the third fastening hole, the fourth fastening hole, the fifth fastening hole, and the sixth fastening hole are screw holes, and the second fasteners and the third fasteners are screws.

15. The spliced display screen of claim 7, wherein the second adjusting hole is a screw hole, and the second adjusting members are screws.

16. The spliced display screen of claim 10, wherein the third adjusting hole is a screw hole, and the third adjusting members are screws.

17. The spliced display screen of claim 7, further comprising:
display units arranged in an array on the second surface of each box.

18. The spliced display screen of claim 17, wherein each display unit comprises one of a mini light-emitting diode display unit, a micro light-emitting diode display unit, or an organic light-emitting diode display unit.

* * * * *